United States Patent
Xu et al.

(10) Patent No.: US 12,136,574 B2
(45) Date of Patent: *Nov. 5, 2024

(54) TECHNIQUE FOR TRAINING NEURAL NETWORK FOR USE IN IN-SITU MONITORING DURING POLISHING AND POLISHING SYSTEM

(71) Applicant: Applied Materials, Inc., Santa Clara, CA (US)

(72) Inventors: Kun Xu, Sunol, CA (US); Kiran Lall Shrestha, San Jose, CA (US); Doyle E. Bennett, Santa Clara, CA (US); David Maxwell Gage, Sunnyvale, CA (US); Benjamin Cherian, San Jose, CA (US); Jun Qian, Sunnyvale, CA (US); Harry Q. Lee, Los Altos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/471,893

(22) Filed: Sep. 21, 2023

(65) Prior Publication Data

US 2024/0014080 A1     Jan. 11, 2024

Related U.S. Application Data

(63) Continuation of application No. 17/317,232, filed on May 11, 2021, now Pat. No. 11,791,224.
(Continued)

(51) Int. Cl.
    *H01L 21/304*        (2006.01)
    *B24B 37/013*        (2012.01)
       (Continued)

(52) U.S. Cl.
    CPC ............ *H01L 22/14* (2013.01); *B24B 37/013* (2013.01); *B24B 49/105* (2013.01); *G06F 17/15* (2013.01);
       (Continued)

(58) Field of Classification Search
    CPC ......... H01L 22/14; H01L 22/12; H01L 22/26; H01L 21/304; H01L 21/3212; G06N 3/04;
       (Continued)

(56) References Cited

U.S. PATENT DOCUMENTS 5,433,651 A    7/1995   Lustig
5,559,428 A    9/1996   Li et al.
(Continued)

FOREIGN PATENT DOCUMENTS

CN     102278967     12/2011
CN     102683237      9/2012
(Continued)

OTHER PUBLICATIONS

International Search Report and Written Opinion in International Appln. No. PCT/US2021/031781, dated Aug. 17, 2021, 8 pages.
(Continued)

*Primary Examiner* — Jeffrey P Aiello
(74) *Attorney, Agent, or Firm* — Fish & Richardson P.C.

(57) ABSTRACT

A method of polishing a substrate includes polishing a conductive layer on the substrate at a polishing station, monitoring the layer with an in-situ eddy current monitoring system to generate a plurality of measured signals values for a plurality of different locations on the layer, generating thickness measurements the locations, and detecting a polishing endpoint or modifying a polishing parameter based on the thickness measurements. The conductive layer is formed of a first material having a first conductivity. Generating
(Continued)

includes calculating initial thickness values based on the plurality of measured signals values and processing the initial thickness values through a neural network that was trained using training data acquired by measuring calibration substrates having a conductive layer formed of a second material having a second conductivity that is lower than the first conductivity to generated adjusted thickness values.

17 Claims, 8 Drawing Sheets

Related U.S. Application Data

(60) Provisional application No. 63/025,108, filed on May 14, 2020.

(51) Int. Cl.
*B24B 49/10* (2006.01)
*G06F 17/15* (2006.01)
*G06N 3/08* (2023.01)
*H01L 21/321* (2006.01)
*H01L 21/66* (2006.01)

(52) U.S. Cl.
CPC .............. *G06N 3/08* (2013.01); *H01L 21/304* (2013.01); *H01L 21/3212* (2013.01); *H01L 22/12* (2013.01); *H01L 22/26* (2013.01)

(58) Field of Classification Search
CPC ......... G06N 3/08; G06F 17/15; B24B 37/013; B24B 49/105
USPC ....... 324/230, 229, 225, 242, 202, 228, 662, 324/222; 438/18, 14; 702/170, 117, 182, 702/189, 179, 81, 97, 84, 155, 64, 105, 702/127, 35, 56
See application file for complete search history.

(56) References Cited

U.S. PATENT DOCUMENTS

| | | |
|---|---|---|
| 5,644,221 A | 7/1997 | Li et al. |
| 5,660,672 A | 8/1997 | Li et al. |
| 6,004,187 A | 12/1999 | Nyui et al. |
| 6,072,313 A | 6/2000 | Li et al. |
| 6,159,073 A | 12/2000 | Wiswesser et al. |
| 6,172,756 B1 | 1/2001 | Geels et al. |
| 6,179,709 B1 | 1/2001 | Redeker et al. |
| 6,190,234 B1 | 2/2001 | Swedek et al. |
| 6,280,289 B1 | 8/2001 | Wiswesser et al. |
| 6,296,548 B1 | 10/2001 | Wiswesser et al. |
| 6,399,501 B2 | 6/2002 | Birang et al. |
| 6,407,546 B1 | 6/2002 | Le et al. |
| 6,433,541 B1 | 8/2002 | Lehman et al. |
| 6,524,165 B1 | 2/2003 | Wiswesser et al. |
| 6,558,229 B2 | 5/2003 | Kimura et al. |
| 6,594,024 B1 | 7/2003 | Singh et al. |
| 6,602,724 B2 | 8/2003 | Redeker et al. |
| 6,707,540 B1 | 3/2004 | Lehman et al. |
| 6,924,641 B1 | 8/2005 | Hanawa et al. |
| 6,945,845 B2 | 9/2005 | Bennett et al. |
| 6,975,107 B2 | 12/2005 | Hanawa et al. |
| 7,001,243 B1 | 2/2006 | Yi et al. |
| 7,008,296 B2 | 3/2006 | Swedek et al. |
| 7,016,795 B2 | 3/2006 | Swedek et al. |
| 7,025,658 B2 | 4/2006 | David |
| 7,097,537 B1 | 8/2006 | David |
| 7,112,960 B2 | 9/2006 | Miller et al. |
| 7,082,345 B2 | 12/2006 | Shanmugasundram et al. |
| 7,153,185 B1 | 12/2006 | Birang et al. |
| 7,189,140 B1 | 3/2007 | Shugrue et al. |
| 7,854,646 B2 | 12/2010 | Togawa et al. |
| 8,010,222 B2 | 8/2011 | Lehman et al. |
| 8,106,651 B2 | 1/2012 | Lahiri et al. |
| 8,284,560 B2 | 10/2012 | Iravani et al. |
| 8,367,429 B2 | 2/2013 | Lee et al. |
| 8,408,965 B2 | 4/2013 | Bennett et al. |
| 9,281,253 B2 | 3/2016 | Xu et al. |
| 10,478,937 B2 | 11/2019 | Tang et al. |
| 10,994,389 B2 | 5/2021 | Xu et al. |
| 11,050,824 B2 * | 6/2021 | Hasek, IV ............ H04L 65/764 |
| 11,658,078 B2 | 5/2023 | Xu et al. |
| 2001/0008827 A1 | 7/2001 | Kimura et al. |
| 2002/0002029 A1 | 1/2002 | Kimura et al. |
| 2002/0013007 A1 | 1/2002 | Hasegawa et al. |
| 2002/0013124 A1 | 1/2002 | Tsujimura et al. |
| 2002/0055192 A1 | 5/2002 | Redeker et al. |
| 2002/0077031 A1 | 6/2002 | Johansson et al. |
| 2002/0098777 A1 | 7/2002 | Laursen et al. |
| 2002/0103564 A1 | 8/2002 | Fielden et al. |
| 2002/0155789 A1 | 10/2002 | Bibby, Jr. et al. |
| 2003/0028279 A1 | 2/2003 | Wang et al. |
| 2003/0053042 A1 | 3/2003 | Chen |
| 2003/0087459 A1 | 5/2003 | Laursen et al. |
| 2004/0119468 A1 | 6/2004 | Gotkis et al. |
| 2004/0259470 A1 | 12/2004 | Swedek et al. |
| 2005/0017712 A1 * | 1/2005 | Le .......................... G01B 7/105 |
| | | 324/230 |
| 2005/0024047 A1 | 2/2005 | Miller et al. |
| 2006/0009132 A1 | 1/2006 | Bennett et al. |
| 2007/0040870 A1 * | 2/2007 | Lu .......................... B41J 2/1606 |
| | | 347/68 |
| 2007/0061036 A1 | 3/2007 | Sakurai et al. |
| 2007/0103150 A1 | 5/2007 | Tada et al. |
| 2007/0155284 A1 | 7/2007 | Ring et al. |
| 2007/0205765 A1 | 9/2007 | Bailey |
| 2007/0224915 A1 | 9/2007 | David et al. |
| 2007/0251922 A1 | 11/2007 | Swedek et al. |
| 2008/0139087 A1 | 6/2008 | Togawa et al. |
| 2009/0104847 A1 | 4/2009 | Kobayashi et al. |
| 2009/0156098 A1 | 6/2009 | Swedek et al. |
| 2009/0306923 A1 * | 12/2009 | Keller ...................... B29C 48/10 |
| | | 356/73 |
| 2010/0099334 A1 | 4/2010 | Bennett et al. |
| 2011/0124269 A1 | 5/2011 | Tada et al. |
| 2011/0189925 A1 | 8/2011 | Iravani et al. |
| 2011/0318992 A1 | 12/2011 | David et al. |
| 2012/0276661 A1 | 11/2012 | Iravani et al. |
| 2013/0000845 A1 | 1/2013 | Lu et al. |
| 2015/0118765 A1 | 4/2015 | Xu et al. |
| 2015/0118766 A1 | 4/2015 | Xu et al. |
| 2015/0224623 A1 | 8/2015 | Xu et al. |
| 2015/0321312 A1 * | 11/2015 | Zhang ................... B24B 37/345 |
| | | 451/28 |
| 2015/0371907 A1 | 12/2015 | Lu et al. |
| 2015/0371913 A1 | 12/2015 | Zhefu et al. |
| 2016/0361791 A1 | 12/2016 | Economikos et al. |
| 2017/0259396 A1 | 9/2017 | Yamamura et al. |
| 2018/0056476 A1 | 3/2018 | Zhang et al. |
| 2018/0203089 A1 | 7/2018 | Xu et al. |
| 2018/0203090 A1 | 7/2018 | Xu et al. |
| 2018/0304435 A1 * | 10/2018 | Xu ......................... G06N 3/084 |
| 2019/0095797 A1 | 3/2019 | Dhandapani et al. |
| 2019/0299356 A1 | 10/2019 | Xu et al. |
| 2020/0021655 A1 * | 1/2020 | Hasek, IV ............ H04L 67/306 |
| 2020/0101579 A1 | 4/2020 | Suzuki |
| 2020/0130136 A1 | 4/2020 | Huang et al. |
| 2020/0298368 A1 | 9/2020 | Osterheld et al. |
| 2021/0229234 A1 | 7/2021 | Xu et al. |
| 2021/0358819 A1 * | 11/2021 | Xu ......................... H01L 21/304 |
| 2023/0290691 A1 | 9/2023 | Xu et al. |

FOREIGN PATENT DOCUMENTS

| | | |
|---|---|---|
| EP | 1063056 | 12/2000 |
| JP | 2009-099842 | 5/2009 |
| JP | 2011-023579 | 2/2011 |
| JP | 2020-053550 | 4/2020 |
| KR | 10-2005-0083844 | 8/2005 |
| KR | 10-2016-0052216 | 5/2016 |
| KR | 10-2017-0015406 | 2/2017 |

(56) References Cited

FOREIGN PATENT DOCUMENTS

| | | |
|---|---|---|
| KR | 10-2020-0047739 | 5/2020 |
| TW | 201842471 | 12/2018 |
| WO | WO 1997/021070 | 6/1997 |
| WO | WO 2001/046684 | 6/1999 |
| WO | WO 2002/087825 | 11/2002 |
| WO | WO 2003/057407 | 7/2003 |
| WO | WO 2004/059242 | 7/2004 |
| WO | WO 2020/067914 | 4/2020 |

OTHER PUBLICATIONS

Office Action in Chinese Appln. No. 202180014451.9, dated Feb. 7, 2024, 10 pages (with English summary and search report).
Office Action in Taiwanese Appln. No. 110117026, dated Apr. 1, 2022, 11 pages (with English search report).
Office Action in Korean Appln. No. 10-2022-7026048, dated Aug. 29, 2024, 18 pages (with English translation).

\* cited by examiner

TECHNIQUE FOR TRAINING NEURAL NETWORK FOR USE IN IN-SITU MONITORING DURING POLISHING AND POLISHING SYSTEM

CROSS-REFERENCE TO RELATED APPLICATIONS

This application is a continuation of U.S. application Ser. No. 17/317,232, filed May 11, 2021, which claims priority to U.S. Provisional Application No. 63/025,108, filed on May 14, 2020, the disclosures of which are incorporated by reference.

TECHNICAL FIELD

The present disclosure relates to reconstruction of measurements made near a substrate edge using in-situ monitoring during polishing of the substrate.

BACKGROUND

An integrated circuit is typically formed on a substrate (e.g., a semiconductor wafer) by the sequential deposition of conductive, semiconductive or insulative layers on a silicon wafer, and by the subsequent processing of the layers.

One fabrication step involves depositing a filler layer over a non-planar surface, and planarizing the filler layer until the non-planar surface is exposed. For example, a conductive filler layer can be deposited on a patterned insulative layer to fill the trenches or holes in the insulative layer. The filler layer is then polished until the raised pattern of the insulative layer is exposed. After planarization, the portions of the conductive layer remaining between the raised pattern of the insulative layer form vias, plugs and lines that provide conductive paths between thin film circuits on the substrate. In addition, planarization may be used to planarize the substrate surface for lithography.

Chemical mechanical polishing (CMP) is one accepted method of planarization. This planarization method typically requires that the substrate be mounted on a carrier head. The exposed surface of the substrate is placed against a rotating polishing pad. The carrier head provides a controllable load on the substrate to push it against the polishing pad. A polishing liquid, such as slurry with abrasive particles, is supplied to the surface of the polishing pad.

During semiconductor processing, it may be important to determine one or more characteristics of the substrate or layers on the substrate. For example, it may be important to know the thickness of a conductive layer during a CMP process, so that the process may be terminated at the correct time. A number of methods may be used to determine substrate characteristics. For example, optical sensors may be used for in-situ monitoring of a substrate during chemical mechanical polishing. Alternately (or in addition), an eddy current sensing system may be used to induce eddy currents in a conductive region on the substrate to determine parameters such as the local thickness of the conductive region.

SUMMARY

In one aspect, a method of polishing a substrate includes polishing a conductive layer on the substrate at a polishing station, monitoring the layer during polishing at the polishing station with an in-situ eddy current monitoring system to generate a plurality of measured signals values for a plurality of different locations on the layer, generating for each location of the plurality of different locations an estimated measure of thickness of the location, and at least one of detecting a polishing endpoint or modifying a polishing parameter based on each estimated measure of thickness. The conductive layer is formed of a first material having a first conductivity. Generating includes calculating initial thickness values based on the plurality of measured signals values and processing the initial thickness values through a neural network that was trained using training data acquired by measuring calibration substrates having a conductive layer formed of a second material having a second conductivity that is lower than the first conductivity to generated adjusted thickness values.

In another aspect, a method of training a neural network for use in an in-situ monitoring system includes scanning a sensor of an in-situ monitoring system across a calibration substrate having a conductive layer formed of a first material having a first conductivity, the monitoring system generating a first set of sensor measurements. Ground truth measurements of the thickness of the conductive layer of the calibrations substrate are obtained to provide a first thickness profile. The first thickness profile is scaled based the first conductivity and a target second conductivity that is greater than the first conductivity to provide a modified second thickness profile equivalent to a thickness profile that would be generated if the conductive layer were formed of a material of the second conductivity. A neutral network is trained to convert sensor measurements from the in-situ monitoring system to thickness measurements for a layer formed of the second material. The training is performed using training data including the modified training profile and calibration thickness values based on the first set of sensor measurements from the conductive layer formed of the first material.

Certain implementations can include one or more of the following advantages. An in-situ monitoring system, e.g., an eddy current monitoring system, can generate a signal as a sensor scans across the substrate. The system can compensate for distortions in a portion of the signal that corresponds to the substrate edge. The signal can be used for endpoint control and/or closed-loop control of polishing parameters, e.g., carrier head pressure, thus providing improved within-wafer non-uniformity (WIWNU) and water-to-wafer non-uniformity (WTWNU). The in-situ monitoring system can generate thickness measurements that are more accurate at very thin layers, e.g., during a clearing step.

The details of one or more implementations are set forth in the accompanying drawings and the description below. Other aspects, features and advantages will be apparent from the description and drawings, and from the claims.

BRIEF DESCRIPTION OF DRAWINGS

Like reference symbols in the various drawings indicate like elements.

DETAILED DESCRIPTION

Figure 1A:
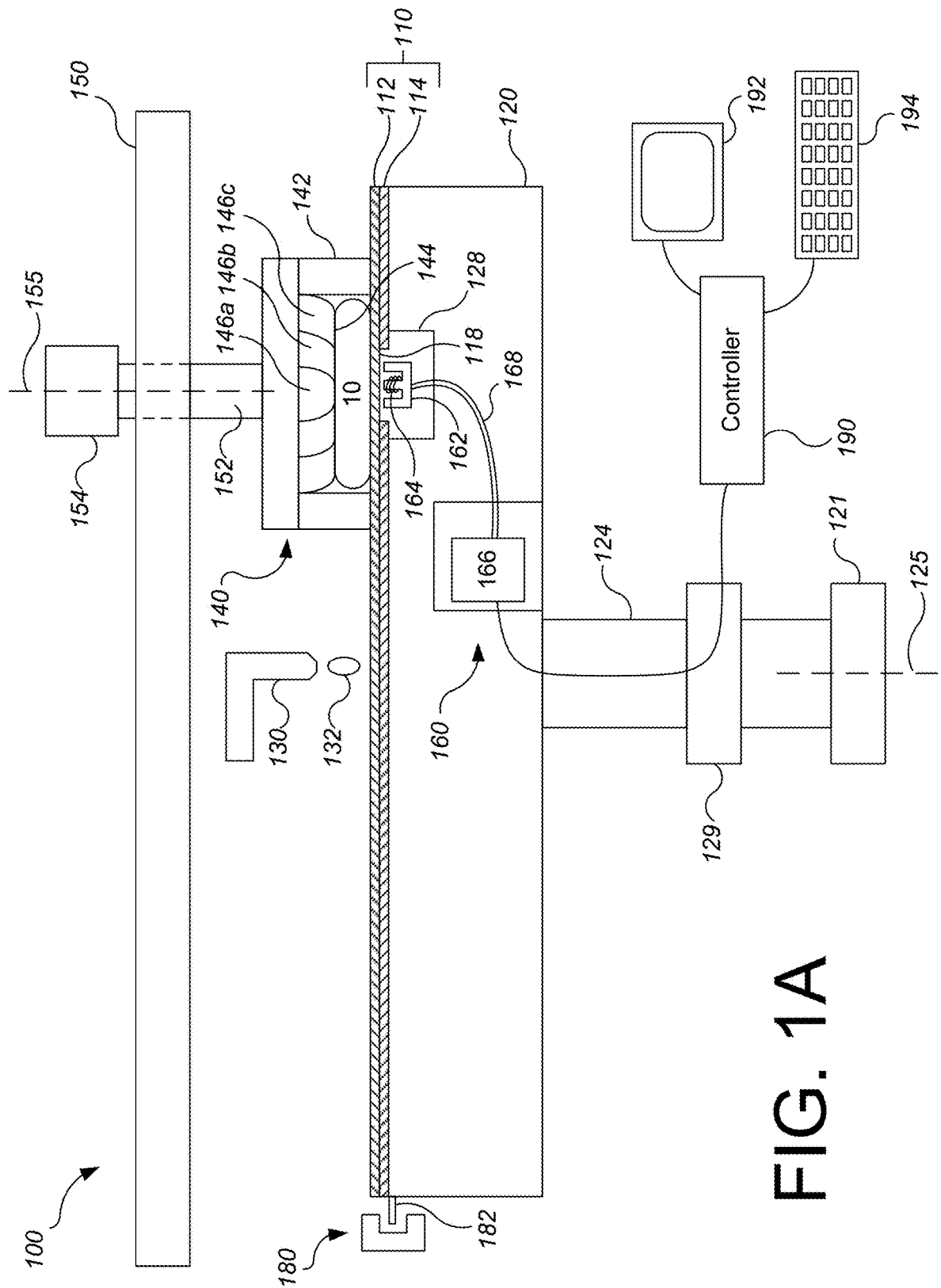
FIG. 1A is a schematic side view, partially cross-sectional, of a chemical mechanical polishing station that includes an eddy current monitoring system.

A polishing apparatus can use an in-situ monitoring system, e.g., an eddy current monitoring system, to detect the thickness of an outer layer that is being polished on a substrate. During polishing of the outer layer, the in-situ monitoring system can determine the thickness of different locations of the layer on the substrate. The thickness measurements can be used to trigger a polishing endpoint and/or to adjust processing parameters of the polishing process in real time. For example, a substrate carrier head can adjust the pressure on the backside of the substrate to increase or decrease the polishing rate of the locations of the outer layer. The polishing rate can be adjusted so that the locations of the layer are substantially the same thickness after polishing. The CMP system can adjust the polishing rate so that polishing of the locations of the layer completes at about the same time. Such profile control can be referred to as real time profile control (RTPC).

An in-situ monitoring system can be subject to signal distortion for measurements at locations close to the substrate edge. For example, an eddy current monitoring system can generate a magnetic field. Near the substrate edge, the signal can be artificially low because the magnetic field only partially overlaps the conductive layer of the substrate. If the eddy current sensor head is large, the signal could be further reduced due to earlier signal drop off due as the larger sensor head may need more time and space to pass over the edge region and lower spatial resolution. A technique to compensate for the distortions at the substrate is to use a neural network to generate modified signals based on the measured signals generated by the in-situ monitoring system.

However, near the end of a polishing operation, e.g., at or approaching clearing to expose the underlying layer, the thickness of the conductive layer becomes increasingly thin and the reconstruction of the signal by the neural network can become unreliable. Without being limited to any particular theory, neural networks may be trained for edge reconstruction using calibration substrates of differing materials that have relatively thick conductive layers; such training may not be suitable to configure the neural network to reconstruct the layer thickness for thin conductive layers at the substrate edge. In particular, thin layers on a calibration wafer can include discontinuities, e.g., regions where the underlying layer has been exposed. As a result, obtaining a ground truth measurement, e.g., using a four-point probe, from the calibration wafer may not be possible, and consequently reliable training data may not be available for thin layers.

However, by collecting signals using calibration wafers with layers that are thicker but composed of materials that have a lower conductivity, measurements can be obtained and then scaled based on the relative conductance ratio between the two calibration wafers to provide training data that is equivalent to thinner layers of higher conductivity. The neural network may be trained using this training data, thereby enhancing the ability of the neural network to generate estimated measures of thickness of the substrate edge for very thin layers made of high conductivity materials.

Figure 1B:
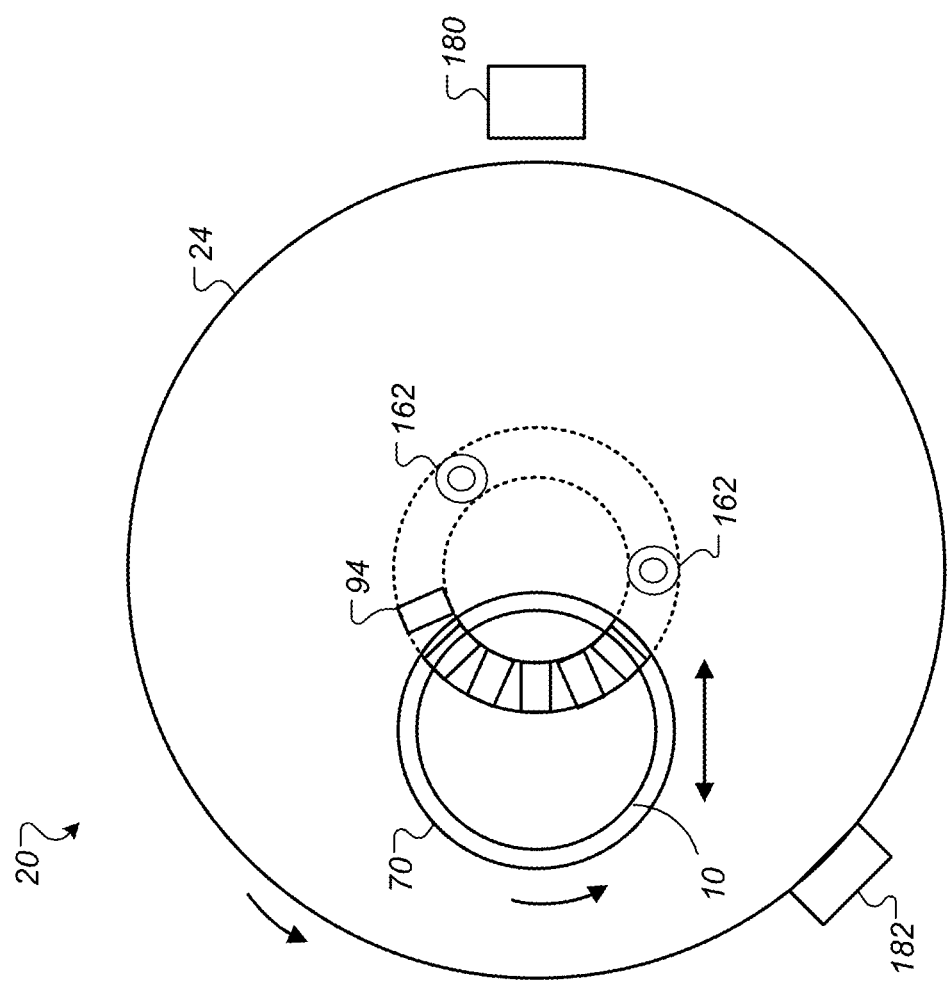
FIG. 1B is a schematic top view of a chemical mechanical polishing station.

FIGS. 1A and 1B illustrate an example of a polishing apparatus 100. The polishing apparatus 100 includes a rotatable disk-shaped platen 120 on which a polishing pad 110 is situated. The platen is operable to rotate about an axis 125. For example, a motor 121 can turn a drive shaft 124 to rotate the platen 120. The polishing pad 110 can be a two-layer polishing pad with an outer polishing layer 112 and a softer backing layer 114.

The polishing apparatus 100 can include a port 130 to dispense polishing liquid 132, such as slurry, onto the polishing pad 110. The polishing apparatus can also include a polishing pad conditioner to abrade the polishing pad 110 to maintain the polishing pad 110 in a consistent abrasive state.

The polishing apparatus 100 includes at least one carrier head 140. The carrier head 140 is operable to hold a substrate 10 against the polishing pad 110. The carrier head 140 can have independent control of the polishing parameters, for example pressure, associated with each respective substrate.

In particular, the carrier head 140 can include a retaining ring 142 to retain the substrate 10 below a flexible membrane 144. The carrier head 140 also includes a plurality of independently controllable pressurizable chambers defined by the membrane, e.g., three chambers 146a-146c, which can apply independently controllable pressures to associated zones on the flexible membrane 144 and thus on the substrate 10. Although only three chambers are illustrated in FIG. 1 for ease of illustration, there could be one or two chambers, or four or more chambers, e.g., five chambers.

The carrier head 140 is suspended from a support structure 150, e.g., a carousel or a track, and is connected by a drive shaft 152 to a carrier head rotation motor 154 so that the carrier head can rotate about an axis 155. Optionally the carrier head 140 can oscillate laterally, e.g., on sliders on the carousel 150 or track; or by rotational oscillation of the carousel itself. In operation, the platen is rotated about its central axis 125, and the carrier head is rotated about its central axis 155 and translated laterally across the top surface of the polishing pad.

While only one carrier head 140 is shown, more carrier heads can be provided to hold additional substrates so that the surface area of polishing pad 110 may be used efficiently.

The polishing apparatus 100 also includes an in-situ monitoring system 160. The in-situ monitoring system 160 generates a time-varying sequence of values that depend on the thickness of a layer on the substrate. The in-situ monitoring system 160 includes a sensor head at which the measurements are generated; due to relative motion between the substrate and the sensor head, measurements will be taken at different locations on the substrate.

The in-situ-monitoring system 160 can be an eddy current monitoring system. The eddy current monitoring system 160 includes a drive system to induce eddy currents in a conductive layer on the substrate and a sensing system to detect eddy currents induced in the conductive layer by the drive system. The monitoring system 160 includes a core 162 positioned in a recess 128 to rotate with the platen, at least one coil 164 wound around a portion of the core 162, and drive and sense circuitry 166 connected by wiring 168 to the coil 164. The combination of the core 162 and coil 164 can provide the sensor head. In some implementations, the core 162 projects above the top surface of the platen 120, e.g., into a recess 118 in the bottom of the polishing pad 110.

The drive and sense circuitry 166 is configured to apply an oscillating electric signal to the coil 164 and to measure the resulting eddy current. A variety of configurations are possible for the drive and sense circuitry and for the configuration and position of the coil(s), e.g., as described in U.S. Pat. Nos. 6,924,641, 7,112,960 and 8,284,560, and in U.S. Patent Publication Nos. 2011-0189925 and 2012-0276661. The drive and sense circuitry 166 can be located in the same recess 128 or a different portion of the platen 120, or could be located outside the platen 120 and be coupled to the components in the platen through a rotary electrical union 129.

In operation the drive and sense circuitry 166 drives the coil 164 to generate an oscillating magnetic field. At least a portion of magnetic field extends through the polishing pad 110 and into substrate 10. If a conductive layer is present on substrate 10, the oscillating magnetic field generates eddy currents in the conductive layer. The eddy currents cause the conductive layer to act as an impedance source that is coupled to the drive and sense circuitry 166. As the thickness of the conductive layer changes, the impedance changes, and this can be detected by the drive and sense circuitry 166. Different conductive layer materials have different conductive characteristics that result in different signal strengths from an eddy current sensor. Copper (Cu) has a high conductivity and is therefore a common material for a conductive layer. Other conductive materials (e.g., cobalt, tungsten, titanium nitride) may be used for the conductive layer based on the particular application, e.g., barrier layer, ferromagnetic memory, etc.

Alternatively or in addition, an optical monitoring system, which can function as a reflectometer or interferometer, can be secured to the platen 120 in the recess 128. If both systems are used, the optical monitoring system and eddy current monitoring system can monitor the same portion of the substrate.

The CMP apparatus 100 can also include a position sensor 180, such as an optical interrupter, to sense when the core 162 is beneath the substrate 10. For example, the optical interrupter could be mounted at a fixed point opposite the carrier head 140. A flag 182 is attached to the periphery of the platen. The point of attachment and length of flag 182 is selected so that it interrupts the optical signal of sensor 180 while the core 162 sweeps beneath substrate 10. Alternatively or in addition, the CMP apparatus can include an encoder to determine the angular position of platen.

A controller 190, such as a general purpose programmable digital computer, receives the intensity signals from the eddy current monitoring system 160. The controller 190 can include a processor, memory, and I/O devices, as well as an output device 192 e.g., a monitor, and an input device 194, e.g., a keyboard.

The signals can pass from the eddy current monitoring system 160 to the controller 190 through the rotary electrical union 129. Alternatively, the circuitry 166 could communicate with the controller 190 by a wireless signal.

Since the core 162 sweeps beneath the substrate with each rotation of the platen, information on the conductive layer thickness is accumulated in-situ and on a continuous real-time basis (once per platen rotation). The controller 190 can be programmed to sample measurements from the monitoring system when the substrate generally overlies the core 162 (as determined by the position sensor). As polishing progresses, the thickness of the conductive layer changes, and the sampled signals vary with time. The time varying sampled signals may be referred to as traces. The measurements from the monitoring systems can be displayed on the output device 192 during polishing to permit the operator of the device to visually monitor the progress of the polishing operation.

In operation, the CMP apparatus 100 can use the eddy current monitoring system 160 to determine when the bulk of the filler layer has been removed and/or to determine when the underlying stop layer has been substantially exposed. Possible process control and endpoint criteria for the detector logic include local minima or maxima, changes in slope, threshold values in amplitude or slope, or combinations thereof.

The controller 190 may also be connected to the pressure mechanisms that control the pressure applied by carrier head 140, to carrier head rotation motor 154 to control the carrier head rotation rate, to the platen rotation motor 121 to control the platen rotation rate, or to slurry distribution system 130 to control the slurry composition supplied to the polishing pad. In addition, the computer 190 can be programmed to divide the measurements from the eddy current monitoring system 160 from each sweep beneath the substrate into a plurality of sampling zones, to calculate the radial position of each sampling zone, and to sort the amplitude measurements into radial ranges, as discussed in U.S. Pat. No. 6,399,501. After sorting the measurements into radial ranges, information on the film thickness can be fed in real-time into a closed-loop controller to periodically or continuously modify the polishing pressure profile applied by a carrier head in order to provide improved polishing uniformity.

Figure 3:
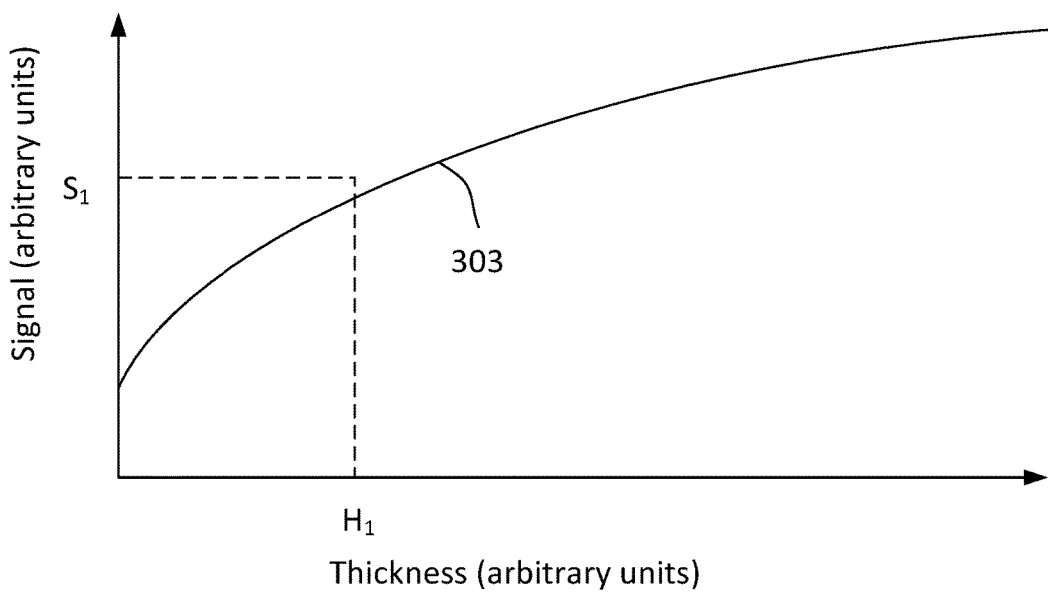
FIG. 3 is a schematic graph of a static formula for determining substrate thickness based on measured signals.

The controller 190 can use a correlation curve that relates the measured signal value by the in-situ monitoring system 160 to the thickness of the layer being polished on the substrate 10 to compute a thickness value of the layer being polished. An example of a correlation curve 303 is shown in FIG. 3. In the coordinate system depicted in FIG. 3, the horizontal axis represents the value of the signal received from the in-situ monitoring system 160, whereas the vertical axis represents the value for the thickness of the layer of the substrate 10. For a given signal value, the controller 190 can use the correlation curve 303 to generate a corresponding thickness value. The correlation curve 303 can be considered a "static" formula, in that it predicts a thickness value for each signal value regardless of the time or position at which the sensor head obtained the signal. The correlation curve can be represented by a variety of functions, such as a polynomial function, or a look-up table (LUT) combined with linear interpolation.

Figure 2:
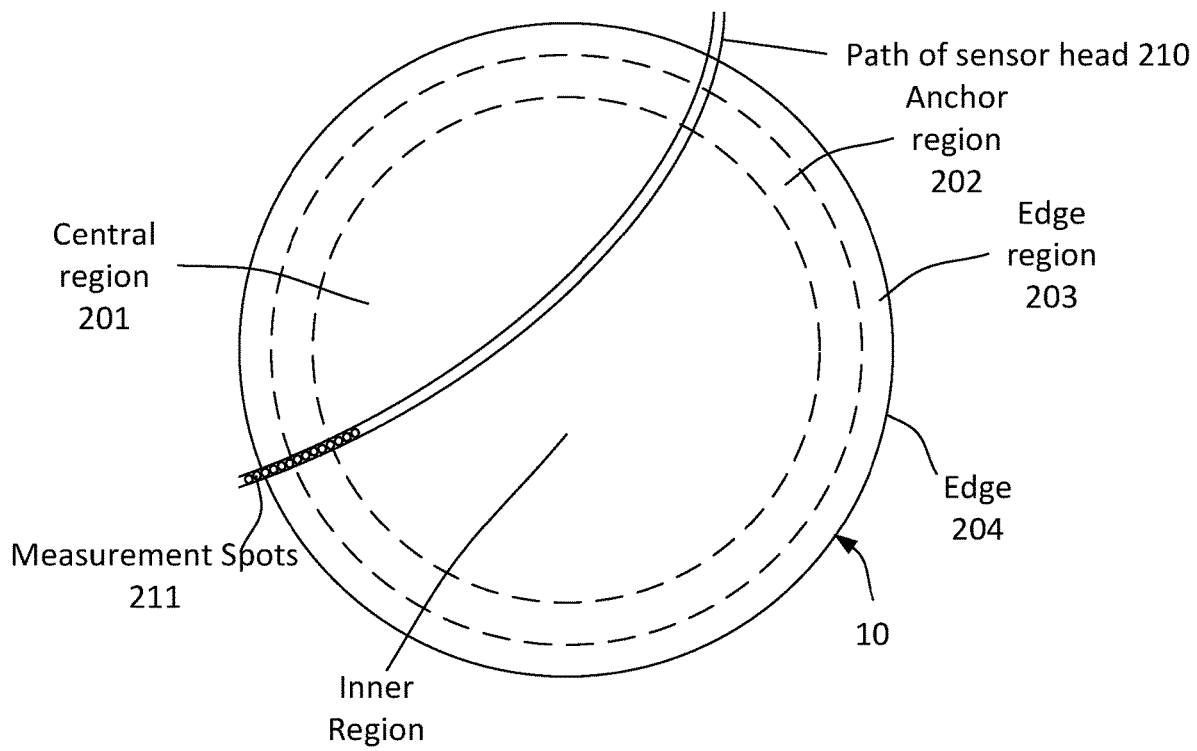
FIG. 2 is a schematic top view of a substrate being scanned by a sensor head of a polishing apparatus.

Referring to FIGS. 1B and 2, changes in the position of the sensor head with respect to the substrate 10 can result in a change in the signal from the in-situ monitoring system 160. That is, as the sensor head scans across the substrate 10, the in-situ monitoring system 160 will make measurements for multiple regions 94, e.g., measurement spots, at different locations on the substrate 10. The regions 94 can be partially overlapping (see FIG. 2).

Figure 4:
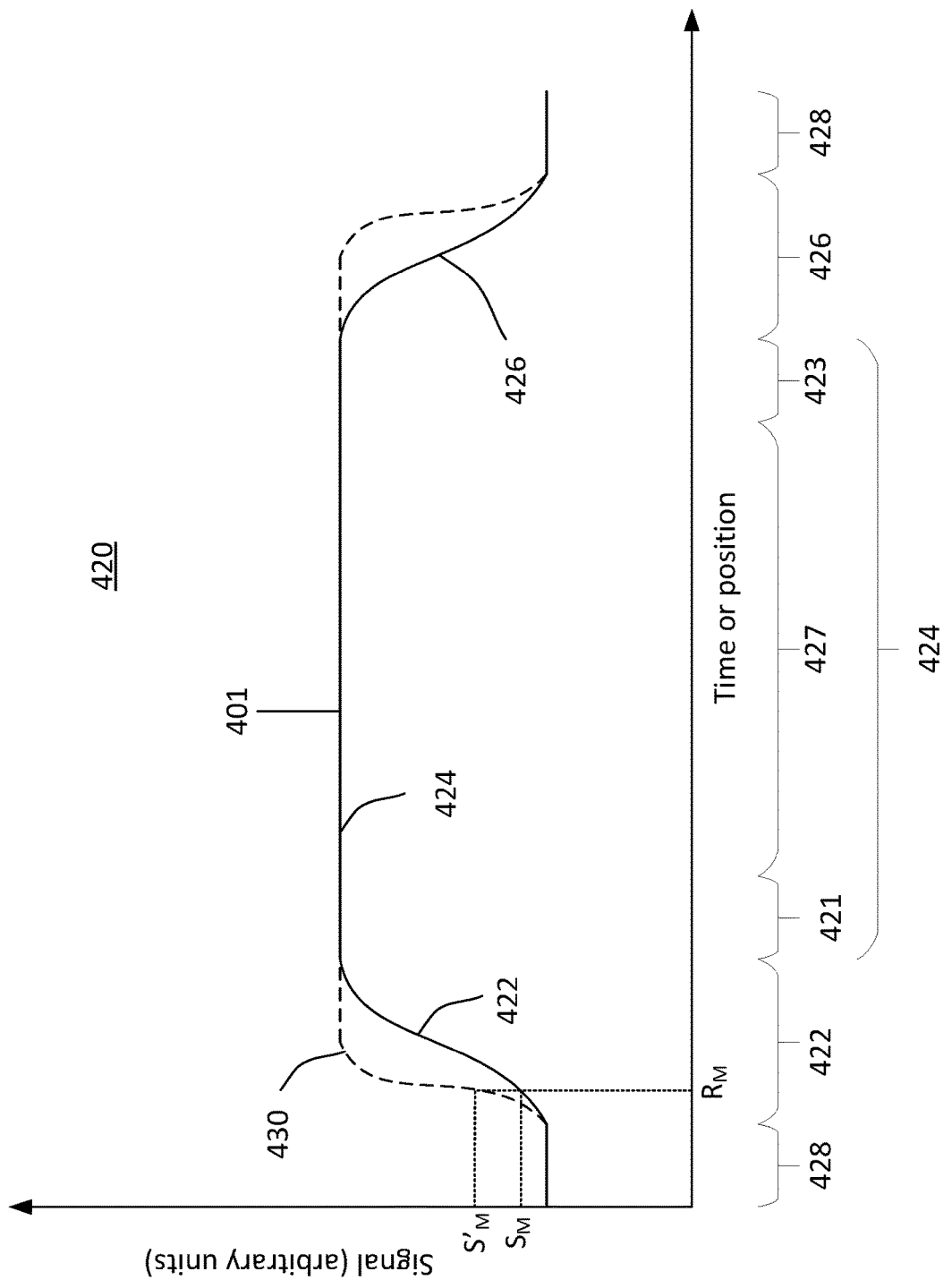
FIG. 4 is a schematic graph of measured signals obtained while monitoring locations on a substrate.

FIG. 4 illustrates a graph 420 that shows a signal 401 from the in-situ monitoring system 160 during a single pass of the sensor head below the substrate 10. The signal 401 is composed of a series of individual measurements from the sensor head as it sweeps below the substrate. The graph 420 can be a function of measurement time or of position, e.g., radial position, of the measurement on the substrate. In either case, different portions of the signal 401 correspond to measurement spots 94 at different locations on the substrate 10 scanned by the sensor head. Thus, the graph 420 depicts, for a given location of the substrate scanned by the sensor head, a corresponding measured signal value from the signal 401.

Referring to FIGS. 2 and 4, the signal 401 includes a first portion 422 that corresponds to locations in an edge region 203 of the substrate 10 when the sensor head crosses a leading edge of the substrate 10, a second portion 424 that corresponds to locations in a central region 201 of the substrate 10, and a third portion 426 that corresponds to locations in edge region 203 when the sensor head crosses a trailing edge of the substrate 10. The signal can also include portions 428 that correspond to off-substrate measurements, i.e., signals generated when the sensor head scans areas beyond the edge 204 of the substrate 10 in FIG. 2.

The edge region 203 can correspond to a portion of the substrate where measurement spots 94 of the sensor head overlap the substrate edge 204. The central region 201 can include an annular anchor region 202 that is adjacent the edge region 203, and an inner region 205 that is surrounded by the anchor region 202. The sensor head may scan these regions on its path 210 and generate a sequence of measurements that correspond to a sequence of locations along the path 210.

In the first portion 422, the signal intensity ramps up from an initial intensity (typically the signal resulting when no substrate and no carrier head is present) to a higher intensity. This is caused by the transition of the monitoring location from initially only slightly overlapping the substrate at the edge 204 of the substrate (generating the initial lower values) to the monitoring location nearly entirely overlapping the substrate (generating the higher values). Similarly, in the third portion 426, the signal intensity ramps down when the monitoring location transitions to the edge 204 of the substrate.

When the bulk of the filler layer has been removed, the metal layer in the edge region 204 of the substrate becomes thin and may develop discontinuities as the raised pattern of the insulating layer is exposed. This leads to additional noise in the first 422 and third portions 426 as well as a second portion 424 of lower signal amplitude. Additionally, if larger eddy current sensors are used to detect the thin conductive filler layers, there is a loss in spatial resolution of the sensor. This results in the first 422 and third portions 426 being further elongated as the monitoring location overlaps earlier and longer with the edge 204 of the substrate, further increasing distortion in the signal due to sensor head overlap with the substrate edge.

Although the second portion 424 is illustrated as flat, this is for simplicity; a real signal in the second portion 424 would likely include fluctuations due both to noise and to variations in the layer thickness. The second portion 424 corresponds to the monitoring location scanning the central region 201. The second portion 424 includes sub-portions 421 and 423 that are caused by the monitoring location scanning the anchor region 202 of the central region 201 and sub-portion 427 that is caused by the monitoring location scanning the inner region 205 of the central region 201.

As noted above, the variation in the signal intensity in the regions 422, 426 is caused in part by measurement region of the sensor overlapping the substrate edge, rather than an intrinsic variation in the thickness or conductivity of the layer being monitored. Consequently, this distortion in the signal 401 can cause errors in the calculating of a characterizing value for the substrate, e.g., the thickness of the layer, near the substrate edge. To address this problem, the controller 190 can include a neural network, e.g., neural network 500 of FIG. 5, to generate a modified thickness value corresponding to one or more locations of the substrate 10 based on the computed thickness values corresponding to those locations.

Figure 5:
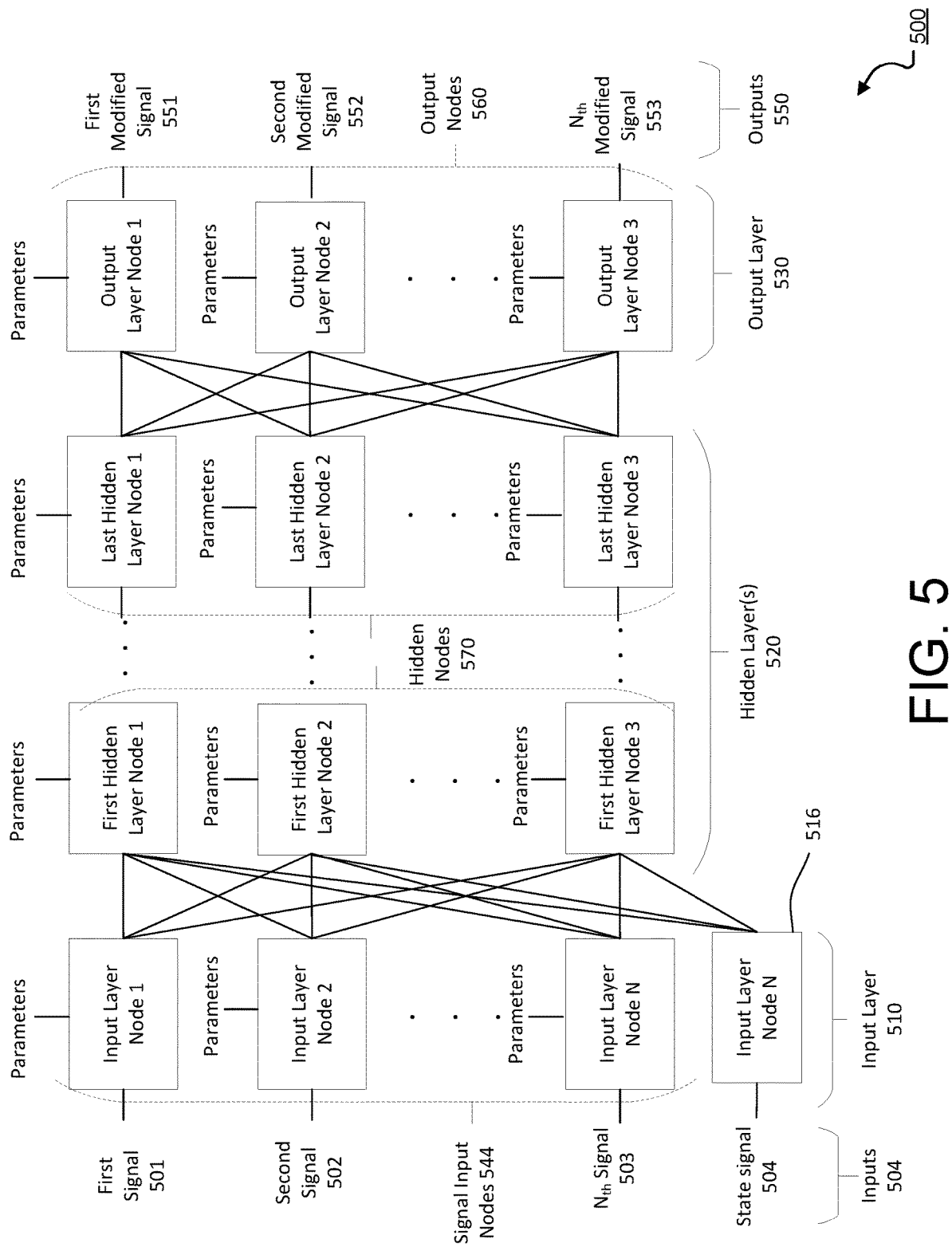
FIG. 5 is an example neural network.

Referring now to FIG. 5, the neural network 500 is configured to, when trained appropriately, generate modified thicknesses values that reduce and/or remove the distortion of computed thickness values near the substrate edge. The neural network 500 receives a group of inputs 504 and processes the inputs 504 through one or more neural network layers to generate a group of outputs 550. The layers of the neural network 500 include an input layer 510, an output layer 530, and one or more hidden layers 520.

Each layer of the neural network 500 includes one or more neural network nodes. Each neural network node in a neural network layer receives one or more node input values (from the inputs 504 to the neural network 500 or from the output of one or more nodes of a preceding neural network layer), processes the node input values in accordance with one or more parameter values to generate an activation value, and optionally applies a non-linear transformation function (e.g., a sigmoid or tan h function) to the activation value to generate an output for the neural network node.

Each node in the input layer 510 receives as a node input value one of the inputs 504 to the neural network 500.

The inputs 504 to the neural network include initial thickness values from the in-situ monitoring system 160 for multiple different locations on the substrate 10, such as a first initial thickness value 501, a second initial thickness value 502, through an $n^{th}$ computed thickness value 503. The initial thickness values can be individual thickness values calculated from the sequence of signal values in the signal 401 using the correlation curve.

In general, the multiple different locations include locations in the edge region 203 and the anchor region 202 of the substrate 10. In some implementations, the multiple different locations are only in the edge region 203 and the anchor region 202. In other implementations, the multiple different locations span all regions of the substrate. In other implementations, the multiple different locations may include locations in the edge region 203 and the anchor region 202 of a second substrate 10. In some implementations, the multiple different locations are only in the edge region 203 and the anchor region 202 of the second substrate. In other implementations, the multiple different locations span all regions of the second substrate.

These initial thickness values are received at signal input nodes 544. Optionally, the input nodes 504 of the neural network 500 can also include one or more state input nodes 516 that receive one or more process state signals 504, e.g., a measure of wear of the pad 110 of the polishing apparatus 100.

The nodes of the hidden layers 520 and output layer 530 are illustrated as receiving inputs from every node of a preceding layer. This is the case in a fully-connected, feedforward neural network. However, the neural network 500 may be a non-fully-connected feedforward neural network or a non-feedforward neural network. Moreover, the neural network 500 may include at least one of one or more fully-connected, feedforward layers; one or more non-fully-connected feedforward layers; and one or more non-feedforward layers.

The neural network generates a group of modified thickness values 550 at the nodes of the output layer 530, i.e., "output nodes" 550. In some implementations, there is an output node 550 for each measured signal from the in-situ monitoring system that is fed to the neural network 500. In this case, the number of output nodes 550 can correspond to the number of signal input nodes 504 of the input layer 510.

For example, the number of signal input nodes 544 can equal the number of measurements in the edge region 203 and the anchor region 202, and there can be an equal number of output nodes 550. Thus, each output node 550 generates a modified thickness value that corresponds to a respective measured signal supplied as an input to a signal input node 544, e.g., the first modified thickness value 551 for the first measured signal 501, the second modified thickness value 552 for the second measured signal 502, and the nth modified thickness value 553 for the nth measured signal 503.

In some implementations, the number of output nodes 550 is smaller than the number of input nodes 504. In some implementations, the number of output nodes 550 is smaller than the number of signal input nodes 544. For example, the number of signal input nodes 544 can equal the number of measurements in the edge region 203, or equal to the number of measurements in the edge region 203 and anchor region 202. Again, each output node 550 of the output layer 530 generates a modified thickness value that corresponds to a respective measured signal supplied as a signal input node 504, e.g., the first modified thickness value 551 for the first measured signal 501, but only for the signal input nodes 554 that receive signals from the edge region 203.

The polishing apparatus 100 can use the neural network 500 to generate modified thickness values. The modified thickness values can then be used as the determined thickness for each location in a first group of locations of a substrate, e.g., the locations in the edge region (and possibly the anchor region). For example, referring back to FIG. 4, the modified thickness values for the edge region can provide a modified portion 430 of the signal 401.

For example, the controller 190 can use the neural network 500 to determine modified thickness value for each of one or more locations in the edge region. Optionally, the controller 190 can use the neural network 500 to determine a modified thickness value for each of one or more locations in the anchor region of the substrate. In contrast, the controller 190 can use the initial thickness values for locations in other regions, e.g., the inner region 205. That is, signal values from locations from other regions, e.g., the inner region 205, can be converted to thickness values which are then used without being modified by the neural network.

In some implementations, for a modified thickness value that corresponds to a given measurement location, the neural network 500 can be configured such that only input signal values from measurement locations within a predetermined distance of that given location are used in determining the modified thickness value. For example, if signal values $S_1$, $S_2, \ldots, S_M, \ldots S_N$ are received, corresponding to measurements at N successive locations on the path 210, a modified thickness value $S'_M$ for the Mth location (indicate at $R_M$) can use only the thickness values $S_{M-L(min\ 1)}, \ldots S_M, \ldots S_{M+L(max\ N)}$ to calculate the modified thickness value $S'_M$. The value of L can be selected such that measurements that are up to about 2-4 mm apart are used to generate a given modified thickness value $S'_M$; measurements within about 1-2 mm, e.g., 1.5 mm, of the location of the measurement $S_M$ can be used. For example, L can be a number from the range 0 to 4, e.g., 1 or 2. For example, if measurements within 3 mm are used, and the spacing between measurements is 1 mm, then L can be 1; if the spacing is 0.5 mm, then L can be 2; if the spacing is 0.25 then L can be 4. However, this can depend on the configuration of the polishing apparatus and the processing conditions. Values of other parameters, e.g., pad wear, could still be used in calculating the modified thickness value $S'_M$.

For example, there can be a number of hidden nodes 570 of the one or more hidden layers 520, i.e., "hidden nodes" 570, equal to the number of signal input nodes 544, with each hidden node 570 corresponding to a respective signal input node 544. Each hidden node 570 can be disconnected from (or have a parameter value of zero for) input nodes 544 that correspond to measurements for locations greater than the predetermined distance from the location of the measurement of the corresponding input node. For example, the $M^{th}$ hidden node can be disconnected from (or have a parameter value of zero for) the $1^{st}$ through $(M-L-1)^{th}$ input nodes 544 and the $(M+L+1)^{th}$ through $N^{th}$ input nodes. Similarly, each output node 560 can be disconnected from (or have a parameter value of zero for) hidden nodes 570 that correspond to the modified thickness for locations that are greater than the predetermined distance from the location of the measurement of the output node. For example, the $M^{th}$ output node can be disconnected from (or have a parameter value of zero for) the $1^{st}$ through $(M-L-1)^{th}$ hidden nodes 570 and the $(M+L+1)^{th}$ through $N^{th}$ hidden nodes.

In order to train the neural network, a training dataset is needed. This training dataset should include a plurality of records, with each record including a group of input values that would be input into the input nodes and a group of desired output values from the output nodes, i.e., the output values that would be desired for that group of input values.

One technique to generate this training dataset is to obtain a group of calibration substrates, each of which has a different thickness profile. Calibration substrates are a group of substrates that may have the same dimensions and regions as a substrate to be polished. The thickness of the layer may be accurately measured, e.g., using a four-point probe, to generate ground truth measurements. Generally, calibration substrates include a layer of the same material that is used as the conductive filler layer that is removed during polishing, e.g., a copper calibration layer for a copper conductive filler layer.

For each calibration substrate, the eddy current sensor of the polishing apparatus 100 can be scanned across the calibration substrate to generate a sequence of calibration signal values. These calibration signal values are similar to the sequence of signal values obtained during polishing, but no pressure or polishing liquid is applied so that no polishing of the calibration substrate is performed. The calibration signal values can be converted to calibration thickness values using the correlation curve. In addition, for each calibration substrate, ground truth thickness measurements are generated for multiple locations on the calibration substrate, e.g., using a four-point probe. The signal values and ground truth thickness measurements can be collected in a number of regions, e.g., the central region 201, anchor region 202, and edge region 203. The calibration thickness values and ground truth thickness measurements for a particular calibration substrate thus provide a record for the training dataset.

Assuming the different calibration substrates have a sufficient variety of thickness profiles and span a sufficient range of thicknesses, it should be possible to train the neural network with the dataset. As such, in a polishing operation where a first substrate is being polished and monitored, a modified thickness value that is generated by the neural network 500 can be considered to be based on the thickness values from measurement locations on a second substrate (a calibration substrate).

Particular problems arise when generating modified thickness values at locations in the edge region if the bulk of the filler layer has been removed. Larger eddy current sensors may be required to detect thin conductive filler layers as the conductive filler layer is removed and the raised pattern of the insulating layer is exposed. Exposing the insulating layer leads to decreased signal quality as the eddy current sensor may span regions containing both conducting and insulating layer areas. A larger eddy current sensor covers a larger area, thereby covering more of both the conducting and insulating layer areas. This may cause a decrease in the slope and increased noise of the first portion of the signal 422. Further decreases in signal arise when the path of the eddy current sensor 210 head attempts to measure the signal from an edge region 203. As such, these regions can have a high variance between the measured initial thickness value and the actual Training data is particularly needed to train the neural network to accurately generate modified thickness values at locations in the edge region where the bulk of the filler layer has been removed.

Figure 6:
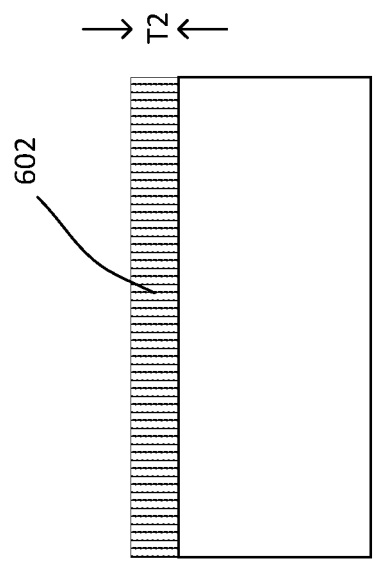
FIG. 6 is a schematic diagram of two calibration wafers of differing materials.
Figure 6:
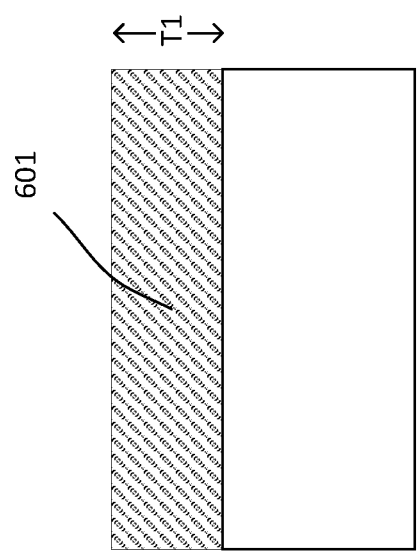

However, obtaining such data, and hence reconstruction of the thickness of thin conductive layers at the edge region 203, is more difficult because of difficulty to produce a calibration wafer of the same material and thickness as a conductive filler layer during later stages of polishing, e.g., clearing. This issue can be at least partially remedied by using a calibration wafer of a first material with a lower conductivity but similar conductance to perform the neural network training for a substrate of a second material. Referring now to FIG. 6, calibration thickness values and ground truth thickness measurements, obtained using the four-point probe and eddy current sensor respectively, of a group of calibration wafers having a layer of a first material 601 may be used as training data to train the neutral network, even when the neural network is then used for in-situ monitoring of a group of substrates having a layer of a second material 602 of different conductivity.

In particular, in order to simulate a second calibration substrate having a thin layer of a second conductive material, a first calibration substrate with a layer of a first conductive material that is thicker layer but lower conductivity can be used, as the conductive layer of the first calibration substrate will have similar conductance to the simulated second calibration substrate. Conductance (G) is a measure of how a material conducts electricity and is defined as $G=\sigma*A/l$ where $\sigma$ is the conductivity, A is the cross sectional area, and l is the length or thickness of a material being measured.

If the conductivity of the first material 601 is lower than that of the second material 602, e.g., $10\times\sigma_1=\sigma_2$, the thickness 610 of the first material can proportionally larger than the thickness 612 of the second material 611, e.g., $l_1=10\times l_2$, to maintain a similar conductance. This permits the operator to select the approximate range of thickness for the conductive layer in the calibration substrates. For example, if there is difficulty in obtaining a calibration substrates having a layer of copper ($\rho=5.96\times10^7$) of microns thickness, instead calibration substrates having a layer of titanium ($\rho=2.38\times10^6$) of 5 to 12.5 microns thickness could be used.

For each calibration substrate having a layer of the second material, the eddy current sensor of the polishing apparatus 100 can be scanned across the calibration substrate to generate a sequence of calibration signal values. The calibration signal values can be converted to calibration thickness values using the correlation curve. The correlation curve assumes that the material has conductivity associated with the first material, but because the conductance of the layers is similar, the eddy current sensor will calibration thickness values that appear as a thinner layer of the first material.

In addition, for each calibration substrate having a layer of the second material, ground truth thickness measurements are generated for multiple locations on the calibration substrate, e.g., using a four-point probe. The ground truth thickness measurements of the calibration wafers are then then be scaled by the ratio of conductivity between the first material and the second material to generate adjusted thickness values. For example, if the substrates to be polished have a copper layer and the correlation curve similarly assumes monitoring of the thickness of a layer of copper ($p=5.96\times10^7$ Ωm), but the calibration substrates have a layer of titanium ($p=2.38\times10^6$ Ωm), then the ground truth thickness measurements can be divided by a factor of about 25 ($5.96\times10^7/2.38\times10^6$) to generate adjusted thickness values that correspond to a copper layer having the same conductance (and thus would generate the same calibration thickness measurements using the eddy current sensor).

For each calibration substrate having a layer of the second material, the calibration thickness values and the adjusted thickness measurements for that calibration substrate can provide a record for the training dataset. This permits generation of a training dataset that includes data that simulates substrates having very thin layers. This permits training of the neural network to properly convert the initial thickness values to adjusted thickness values where the layer is very thin, and thus improves accuracy and reliability of the in-situ monitoring system.

Possible materials for first and second materials include coper, aluminum, tungsten, cobalt, titanium, and titanium nitride. As noted above, the first material can have a higher conductivity than the second material. In some implementations, the first material is be copper, aluminum or tungsten. In some implementations, the second material is be cobalt, titanium or titanium nitride.

In some implementations, the training dataset includes data obtained only from calibration substrates having a conductive layer of different composition than the first material. In some implementations, the training dataset includes data obtained from a first group of calibration substrates that have a conductive layer of a second material that is different composition than the first material, and data obtained from a second group of calibration substrates that have a conductive layer of the first material.

Figure 7:
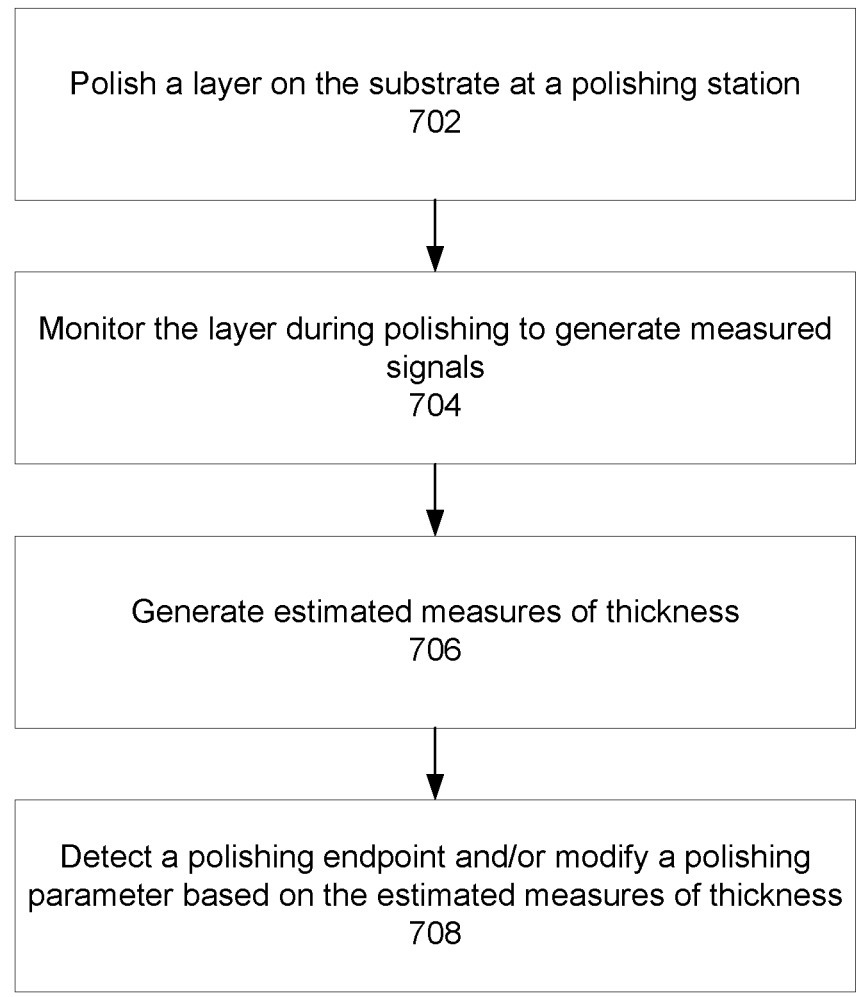
FIG. 7 is a flow diagram of an example process for polishing a substrate.

FIG. 7 is a flow-diagram of an example process 700 for polishing a substrate 10. The process 700 can be performed by the polishing apparatus 100.

The polishing apparatus 100 polishes (702) a layer on the substrate 10 and monitors (704) the layer during the polishing to generate measured signal values for different locations on the layer. The locations on the layer can include one or more locations within the edge region 203 of the substrate (corresponding to the regions 422/426 of the signal 401), and one or more locations within an anchor region 202 on the substrate (corresponding to regions 421/423 of the signal). The anchor region 202 is spaced away from the substrate edge 204 and within a central region 201 of the substrate, and thus is not affected by the distortion created by the substrate edge 204. However, the anchor region 202 can be adjacent to the edge region 203. The anchor region 202 can also surround the inner region 205 of the central region 201. The number of anchor locations can depend on the measurement spot size and measurement frequency by the in-situ monitoring system 160. In some embodiments, the number of the anchor locations cannot exceed a maximum value, such as a maximum value of 4.

The polishing apparatus 100 generates (706) an initial thickness value for each location of the different locations based applying the static formula to the measured signal for the location.

The inputs to the neural network 500 may be computed thickness values generated by the in-situ monitoring system 160 for the different locations. In some embodiments, the apparatus 100 updates each measured signal by normalizing the value of the signals. Such normalization can increase the likelihood that at least some of the inputs 504 to the neural network system 500 fall within a particular range, which in turn can increase the quality of training of the neural network and/or the accuracy of the inference made by the neural network 500. The normalized signal values may then be made into normalized thickness values by applying the static formula.

The outputs of the neural network 500 are modified thickness values each corresponding to an input computed thickness value. If the inputs are normalized thickness values, the modified thickness values corresponding to the computed thickness values will also be normalized thickness values. Therefore, the polishing apparatus 100 may need to convert such modified thickness values to non-normalized values before using modified signals to estimate thickness of substrate.

The polishing apparatus 100 detects (708) a polishing endpoint and/or modify a polishing parameter based on each modified thickness value.

Figure 8:
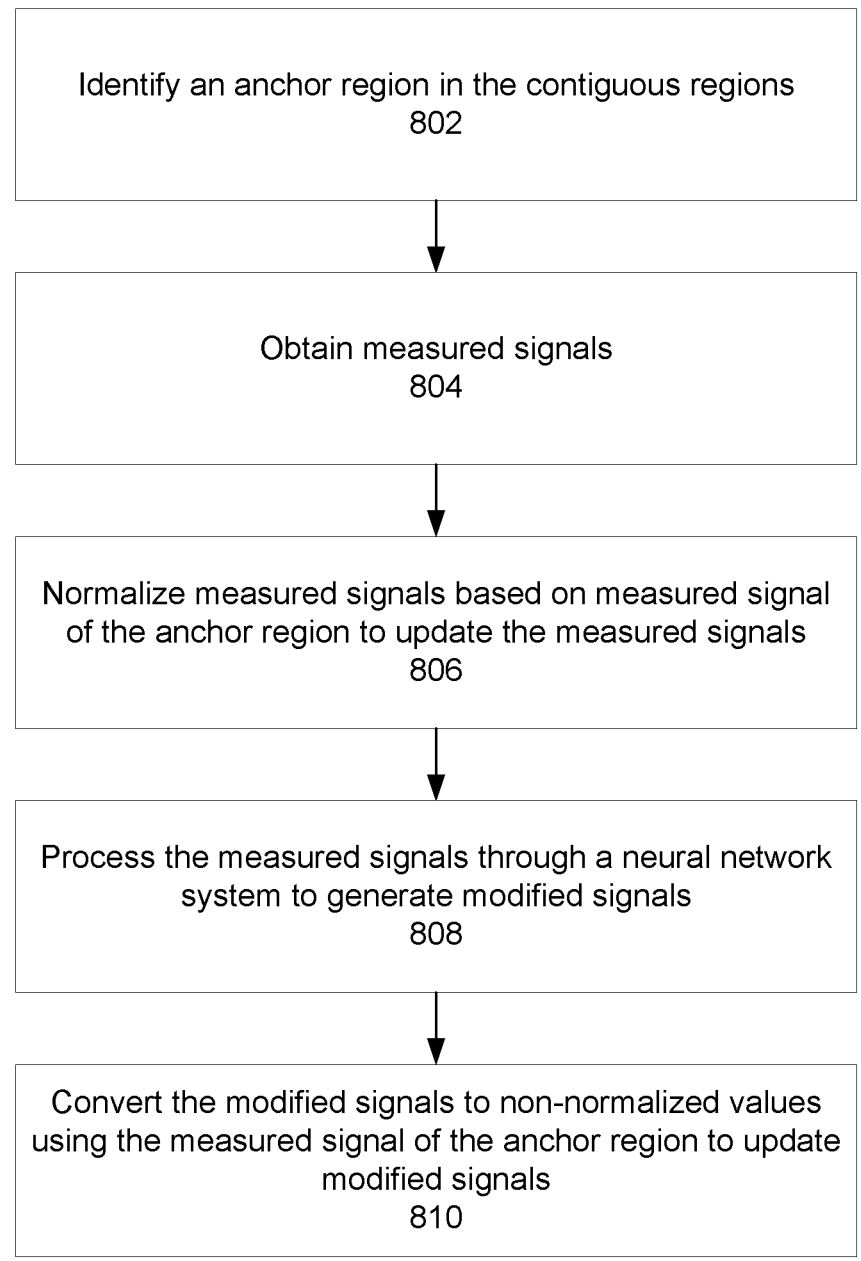
FIG. 8 is a flow diagram of an example process for generating estimated measures of thickness using a neural network.

FIG. 8 is a flow diagram of an example process 800 for generating modified thickness values using a neural network 500. The process 800 can be performed by the polishing apparatus 100.

The polishing apparatus 100 identifies (802) an anchor location of a group of locations of the substrate and obtains (804) measured signals for each location of the group of locations. In some embodiments, the anchor location is spaced away from the edge of the substrate.

The polishing apparatus 100 normalizes (806) each measured signal value based on the measured signal value of the anchor location, e.g., by dividing each measured signal value at every location by the measured signal of the anchor location, to update the measured signals. The polishing apparatus 100 then processes (808) the normalized measured signal values through the neural network 500 to generate modified thickness values for each normalized measured signal value. The polishing apparatus 100 then converts (810) the modified thickness values to non-normalized signal values using the measured signal value of the anchor location, e.g., by multiplying each measured signal value at every location by the measured signal of the anchor location, to update the measured signals. The polishing apparatus 100 then uses (612) non-normalized modified signal values to generate a computed thickness value of each location of the group of locations of the neural network 500.

The monitoring system can be used in a variety of polishing systems. Either the polishing pad, or the carrier head, or both can move to provide relative motion between the polishing surface and the substrate. The polishing pad can be a circular (or some other shape) pad secured to the platen, a tape extending between supply and take-up rollers, or a continuous belt. The polishing pad can be affixed on a platen, incrementally advanced over a platen between polishing operations, or driven continuously over the platen during polishing. The pad can be secured to the platen during polishing, or there can be a fluid bearing between the platen and polishing pad during polishing. The polishing pad can be a standard (e.g., polyurethane with or without fillers) rough pad, a soft pad, or a fixed-abrasive pad.

Although the discussion above focuses on an eddy current monitoring system, the correction techniques can be applied to other sorts of monitoring systems, e.g., optical monitoring systems, that scan over an edge of substrate. In addition, although the discussion above focuses on a polishing system, the correction techniques can be applied to other sorts of substrate processing systems, e.g., deposition or etching systems, that include an in-situ monitoring system that scans over an edge of substrate.

A number of embodiments of the invention have been described. Nevertheless, it will be understood that various modifications may be made without departing from the spirit and scope of the invention. Accordingly, other embodiments are within the scope of the following claims.

What is claimed is:

1. A computer program product, tangibly embodied in a non-transitory computer readable medium, comprising instructions to cause one or more computers to:
   receive from a monitoring system a first set of sensor measurements generated by scanning a sensor of an in-situ monitoring system across a calibration substrate having a conductive layer formed of a first material having a first conductivity;
   receive ground truth measurements of a thickness of the conductive layer of the calibrations substrate to provide a first thickness profile;
   scale the first thickness profile based the first conductivity and a target second conductivity that is greater than the first conductivity to provide a modified second thickness profile equivalent to a thickness profile that would be generated if the conductive layer were formed of a second material of the second conductivity;
   train a neutral network to convert sensor measurements from the in-situ monitoring system to thickness measurements for a layer formed of the second material to generate a trained neural network, the training performed using training data including the modified second thickness profile and calibration thickness values based on the first set of sensor measurements from the conductive layer formed of the first material;
   during polishing of a conductive layer formed of a first material having a first conductivity on a substrate at a polishing station, receive from an in-situ eddy current monitoring system a plurality of measured signals values for a plurality of different locations on the layer;
   generate thickness measurements for the locations, the instructions to generate thickness measurements including instructions to calculate initial thickness values based on the plurality of measured signals values and process the initial thickness values through the neural network; and
   at least one of detect a polishing endpoint or modify a polishing parameter based on the thickness measurements.

2. The computer program product of claim 1, wherein the instructions to train include instructions to train the neural network using training data acquired by measuring calibration substrates having a conductive layer formed of the first material.

3. The computer program product of claim 1, wherein the instructions to calculate initial thickness values include instructions to convert the measured signal values to initial thickness values using a correlation curve.

4. The computer program product of claim 3, comprising instructions to input the initial thickness values into input nodes of the neural network and at least some of the thickness measurements from output nodes of the neural network.

5. The computer program product of claim 4, comprising instructions to, for each location of a second plurality of different locations, receive a signal value from the sensor of the in-situ eddy current monitoring system and convert the signal value to an initial thickness value using the correlation curve, and wherein the initial thickness value provides one of the thickness measurements without correcting the initial thickness value using the neural network.

6. The computer program product of claim 1, wherein the instructions to scale the first thickness profile comprise instructions to divide ground truth measurements by a ratio of the second conductivity to the first conductivity.

7. A method of polishing a substrate, comprising:
scanning a sensor of an in-situ monitoring system across a calibration substrate having a conductive layer formed of a first material having a first conductivity, the monitoring system generating a first set of sensor measurements;
obtaining ground truth measurements of a thickness of the conductive layer of the calibrations substrate to provide a first thickness profile;
scaling the first thickness profile based the first conductivity and a target second conductivity that is greater than the first conductivity to provide a modified second thickness profile equivalent to a thickness profile that would be generated if the conductive layer were formed of a second material of the second conductivity,
training a neutral network to convert sensor measurements from the in-situ monitoring system to thickness measurements for a layer formed of the second material to generate a trained neural network, the training performed using training data including the modified second thickness profile and calibration thickness values based on the first set of sensor measurements from the conductive layer formed of the first material;
during polishing of a conductive layer on a substrate at a polishing station, the conductive layer formed of a first material having a first conductivity;
monitoring the layer during polishing at the polishing station with an in-situ eddy current monitoring system to generate a plurality of measured signals values for a plurality of different locations on the layer;
generating thickness measurements for the locations, the generating including calculating initial thickness values based on the plurality of measured signals values and processing the initial thickness values through the trained neural network; and
at least one of detecting a polishing endpoint or modifying a polishing parameter based on thickness measurements.

8. The method of claim 7, comprising training the neural network using training data acquired by measuring calibration substrates having a conductive layer formed of the first material.

9. The method of claim 7, wherein the first material and the second material are selected from the group including copper, aluminum, cobalt, tungsten, titanium and titanium nitride.

10. The method of claim 9, wherein the first material is copper and the second material is tungsten or titanium nitride.

11. The method of claim 7, wherein obtaining ground truth measurements comprises measuring the calibration substrate with a four-point probe.

12. A polishing system comprising:
a platen to support a polishing pad;
a carrier head to hold a substrate in contact with the polishing pad;
an in-situ eddy current monitoring system; and
a controller configured to
receive from the monitoring system a first set of sensor measurements generated by scanning a sensor of an in-situ monitoring system across a calibration substrate having a conductive layer formed of a first material having a first conductivity,
receive ground truth measurements of a thickness of the conductive layer of the calibrations substrate to provide a first thickness profile,
scale the first thickness profile based the first conductivity and a target second conductivity that is greater than the first conductivity to provide a modified second thickness profile equivalent to a thickness profile that would be generated if the conductive layer were formed of a second material of the second conductivity,
train a neutral network to convert sensor measurements from the in-situ monitoring system to thickness measurements for a layer formed of the second material to generate a trained neural network, the training performed using training data including the modified training profile and calibration thickness values based on the first set of sensor measurements from the conductive layer formed of the first material,
receive from the in-situ eddy current monitoring system a plurality of measured signals values for a plurality of different locations on the layer;
generate thickness measurements for the locations by calculating initial thickness values based on the plurality of measured signals values and processing the initial thickness values through the trained neural network, and
at least one of detect a polishing endpoint or modify a polishing parameter based on the thickness measurements.

13. The system of claim 12, wherein the controller is configured to calculate initial thickness values by converting the measured signal values to initial thickness values using a correlation curve.

14. The system of claim 12, wherein the controller is configured to input the initial thickness values into input nodes of the neural network and receive the estimated measures of thickness from the output nodes.

15. The system of claim 12, wherein the controller is configured to, for each location of a second plurality of different locations, receive a signal value from the sensor of the in-situ eddy current monitoring system and convert the signal value to an initial thickness value using a correlation curve, and wherein the initial thickness value provides the estimated measure of thickness without correcting the initial thickness value using the neural network.

16. The system of claim 12, wherein the controller is configured to calculate the calibration thickness values by receiving signal values from the sensor of the in-situ eddy current monitoring system and converting the signal values to calibration thickness values using a correlation curve.

17. The system of claim 16, wherein the controller is configured to scale the first thickness profile by dividing ground truth measurements by a ratio of the second conductivity to the first conductivity.

\* \* \* \* \*